United States Patent [19]
Nakatani

[11] Patent Number: 4,985,663
[45] Date of Patent: Jan. 15, 1991

[54] DISPLAY DEVICE
[75] Inventor: Hiroshi Nakatani, Tenri, Japan
[73] Assignee: Sharp Kabushiki Kaisha, Oska, Japan
[21] Appl. No.: 242,433
[22] Filed: Sep. 8, 1988
[30] Foreign Application Priority Data Sep. 9, 1987 [JP] Japan .......................... 62-137714[U]

[51] Int. Cl.⁵ .......................... G02F 1/13; G09G 3/02; H01L 23/02; H02G 3/06
[52] U.S. Cl. .................................. 315/169.3; 174/52.4; 174/88 R; 174/94 R; 340/718; 350/334
[58] Field of Search .............................. 340/718, 719; 315/169.4, 169.1, 169.3; 174/52.4, 88 R, 94 R; 350/334

[56] References Cited
U.S. PATENT DOCUMENTS

| 4,113,981 | 9/1978 | Fujita et al. | 174/88 R |
| 4,400,709 | 8/1983 | de Kermadec et al. | 346/154 |
| 4,588,456 | 5/9186 | Dery et al. | 174/88 R |
| 4,640,981 | 2/1987 | Dery et al. | 174/88 R |
| 4,642,421 | 2/1987 | Dery et al. | 174/88 R |
| 4,680,226 | 7/1987 | Takeda | 428/327 |
| 4,697,885 | 10/1987 | Minowa et al. | 174/94 R |
| 4,729,809 | 3/1988 | Dery et al. | 174/94 R |
| 4,740,657 | 4/1988 | Tsukagoshi et al. | 174/94 R |

FOREIGN PATENT DOCUMENTS 60-103328 6/1985 Japan .
61-3126 1/1986 Japan .

Primary Examiner—Eugene R. LaRoche
Assistant Examiner—Michael B. Shingleton

[57] ABSTRACT

A display device includes a display panel having electrodes with a plurality of terminals, a driver circuit having electrodes corresponding to the display panel electrodes, and an anisotropic conductive film for electrically connecting the display panel electrodes with the driver circuit electrodes. The connecting part of each of the driver circuit electrodes to be connected with each of the display panel electrodes includes a first connecting portion and a second connecting portion, where the first connecting portion is more narrow than the second connecting portion.

7 Claims, 3 Drawing Sheets

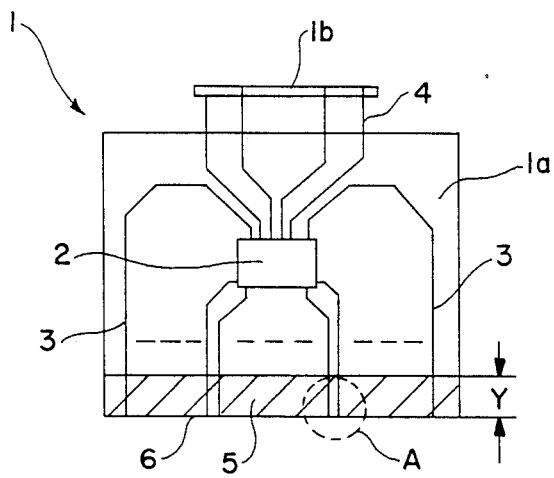
FIG. 1
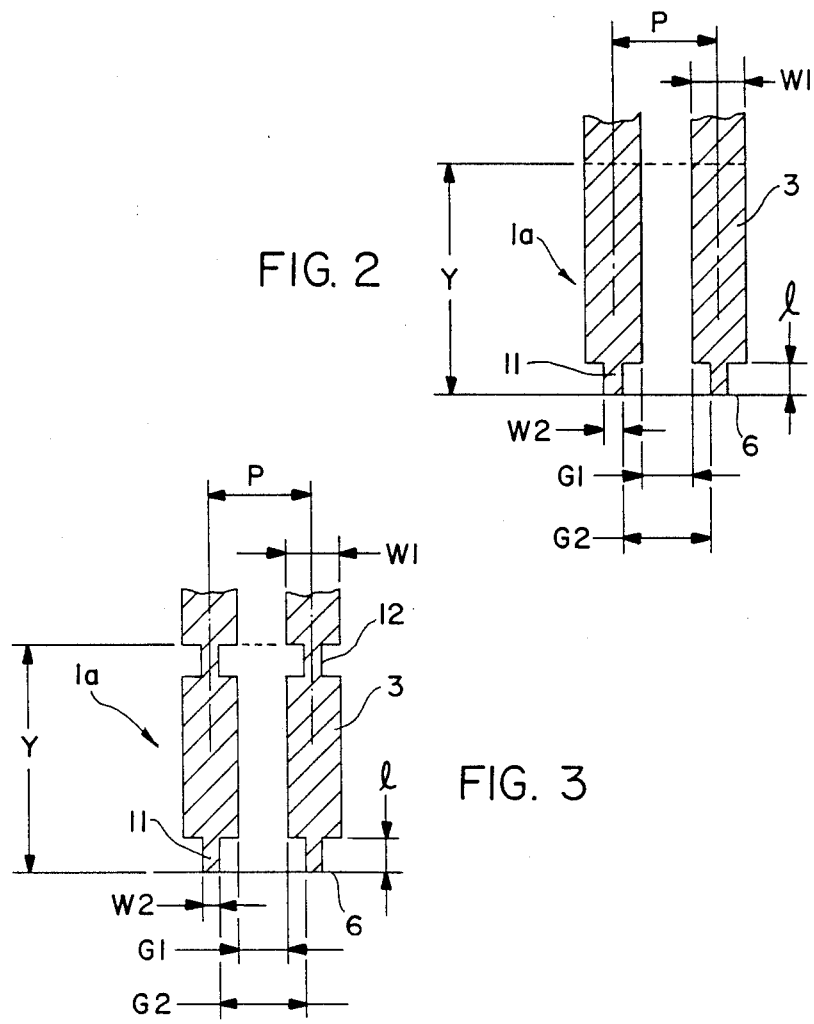
FIG. 2
FIG. 3

DISPLAY DEVICE

BACKGROUND OF THE INVENTION

The present invention relates to a display device, or particularly to a flat type display device which uses an anisotropic conductive film for connection with a driver circuit.

Flat display panels such as LCD (liquid crystal display), ECD (electrochromic display), EL (electro luminescence) and PDP (plasma display panel) (hereinafter referred to as display panels) have electrodes with multiple terminals. Tape automated bonding (TAB) is one of the applicable techniques for mounting an LSI driver for driving a display device with multi-terminal electrodes. Normally, the LSI driver is mounted on a tape carrier by inner lead bonding (ILB), and an anisotropic conductive film is temporarily applied by pressure to the tape carrier on the surface to be in contact with the display panel. The tape carrier, which has the LSI driver is mounted therein, is positioned on the display panel and connected to the display panel under heat pressure.

Hereinafter, the anisotropic conductive film will be described in detail. As shown in FIG. 5, the conventional anisotropic conductive resin tape for heat pressure connection contains conductive particles 102' such as Ag, Ni and Cu in powder form and carbon fibers in a resin tape 101'. The resin tape 101' which is clamped under a certain pressure between the terminals 104 on a PC board 103, for example, and the terminal 106 on a glass substrate 105 is heated. Then the adhesive property of the resin permits a firm connection between the PC board 103 and the glass substrate 105. The conductive particles 102' existing between the terminals 104 and 106 effects the electrical connection between the board 103 and the substrate 105. This type of anisotropic conductive film is disclosed in the U.S. Pat. No. 4,113,981. The anisotropic conductive film having conductive particles 102' which are elastic is disclosed in the U.S. Pat. No. 4,680,226.

The method of electrically connecting the LSI driver mounted on a tape carrier to the terminals of a display panel using the anisotropic conductive film is described as follows with reference to FIGS. 6 and 7.

The tape carrier includes electrodes 203 and 204 formed on a base material 201. The LSI driver 202 is mounted by ILB in the center of the tape carrier. The output of the LSI 202 is led to the cut end 206 of the tape carrier, and the input is led in the opposite direction. The output portion serves as an area 205 for connection with a display panel 207. The anisotropic conductive film 208 is temporarily applied by pressure to this contact area 205, and then the tape carrier is connected to the display panel 207 by heating under pressure.

With the tape carrier of the above construction, however, when the anisotropic conductive film 208 is heated under pressure, the film may extend to the region between the electrodes and to the areas 209 and 210 outside the contact area 205. If metal particles in the anisotropic conductive film 208 extend to the areas 209 and 210 between the electrodes, a conducting path is formed by the metal particles, which causes electrical leakage and/or short circuits.

SUMMARY OF THE INVENTION

In view of the above described problem, an object of the present invention is to provide a display device in which the terminals of the driver circuit are connected to the terminals of the flat display panel without causing leakage and/or short circuits.

Another object of the present invention is to provide a display device whose terminal configuration is designed to prevent leakage and/or short circuits when the terminals are electrically connected with each other via the anisotropic conductive film.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, according to an embodiment of the present invention, a display device includes a display panel having electrodes with a plurality of terminals, a driver circuit having electrodes corresponding to the display panel electrodes, and an anisotropic conductive film for forming an electrical connection between the display panel electrodes and the driver circuit electrodes. The connecting part of each driver circuit electrode to be linked with each display panel electrode includes a first connecting section and a second connecting section, where the first connecting section has a smaller width than the second connecting section. Preferably, the end portion of the connecting part is the first connecting section and the central portion is the second connecting section. The driver circuit may be a tape carrier on which the LSI driver is mounted.

According to the above embodiment of the invention, the electrode-to-electrode distance can be made larger at the end portion than at the central portion of the connecting part of the driver circuit electrode which is joined with the display panel electrode. Therefore, if the anisotropic conductive film is extended beyond the cut end of the tape carrier and metal particles contained in the anisotropic conductive film gather in the area beyond the cut end, electric leakage and/or short circuits never occur between the electrodes due to the large gap between the electrodes.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIG. 1 is a plan view of a tape carrier of the display device of the present invention, on which an LSI driver is mounted as a display device driver circuit by inner lead bonding;

FIG. 2 is an enlarged view of part "A" of FIG. 1 in one embodiment of the present invention;

FIG. 3 is an enlarged view of part "A" of FIG. 1 in a second embodiment of the present invention;

DETAILED DESCRIPTION OF THE EMBODIMENTS

Figure 4:
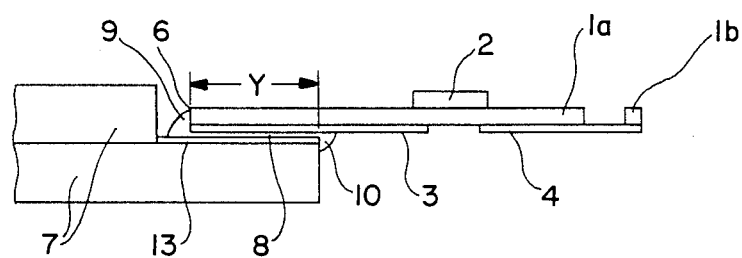
FIG. 4 illustrates the connection between the display panel and the driver LSI according to an embodiment of the present invention.
Figure 5:
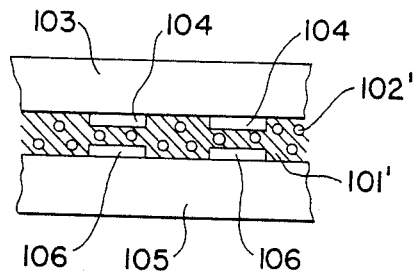
FIG. 5 is a sectional view for explaining the anisotropic conductive film.
Figure 6:
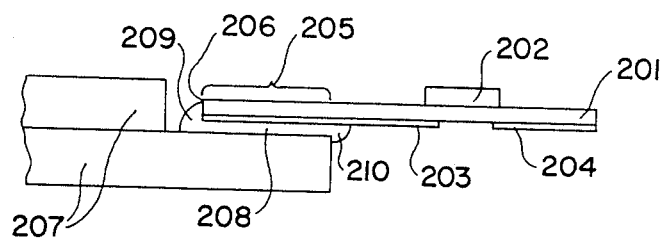
FIGS. 6 and 7 are illustrations for explaining the connection between a display panel and a driver LSI according to the conventional art.
Figure 7:
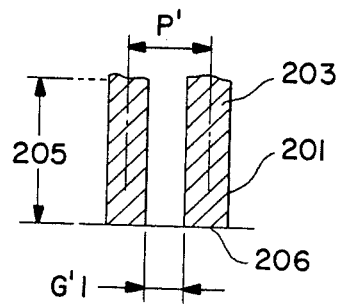

An embodiment of the present invention is described as follows with reference to FIGS. 1 and 2.

This embodiment is applicable to a flat type display device such as LCD (liquid crystal display), ECD (electrochromic display), EL (electro luminescence) and PDP (plasma display panel). Normally, the flat display device has electrodes with multiple terminals to which the electrodes of an external circuit (a driver circuit, for instance) are connected.

An embodiment of the present invention is described below for the case where a TAB (tape automated bonding) technique is used in mounting an LSI driver for driving a display device having multi-terminal electrodes.

According to the present embodiment, the LSI driver is mounted on a tape carrier by ILB (inner lead bonding), anisotropic conductive film is temporarily applied by pressure to the tape carrier on the surface to be made in contact with a display panel, and the tape carrier with the LSI driver mounted thereon is positioned with respect to the display panel and connected with the display panel by heating under pressure.

FIG. 1 is a plan view of the tape carrier on which the driver circuit for driving the display device is mounted by inner lead bonding. FIG. 2 is an enlarged view of part "A" of FIG. 1.

The tape carrier 1 includes a plurality of electrode terminals 3 and a plurality of electrode terminals 4 formed on a polyimide layer or the like base material 1a. A part of the electrode terminal 4 is formed on a separate polyimide layer or the like base material layer 1b. An LSI driver 2 is mounted in the center of the tape carrier 1 by ILB. The electrode terminals of the LSI driver 2 are connected to the electrode terminals 3 and 4 on the tape carrier 1, respectively. The electrode terminals 3 are connected to the output side, and the electrode terminals 4 to the input side of the LSI driver 2. The output electrode terminals of the LSI driver 2 are led to the cut end 6 of the tape carrier 1, and the input electrode terminals are led to the opposite end of the tape carrier 1.

The portion in the region 5 of each electrode terminal 3 extended to the cut end 6 is connected with each of the multiple electrode terminals 13 of the display panel. The electrode terminals 4 on the other side are connected with an external circuit (such as a power supply);

In this state, the anisotropic conductive film is temporarily applied by pressure to the connecting region 5 of the tape carrier 1, and the electrode terminals 3 of the LSI driver 2 are positioned to correspond to the electrode terminals 13 of the display panel 7. The electrode terminals of the LSI driver 2 on the tape carrier 1 are then heated under pressure for connecting with the electrode terminals of the display panel 7 (see FIG. 4).

In this embodiment, to overcome the conventional problems, the electrode terminals of the LSI driver 2 are formed as described below. In the description, the length in the connecting region 5 of the LSI driver electrode terminals 3 to be connected with the display panel electrode terminals 13 is assumed to be Y, the width of each of the electrode terminals 3 is assumed to be W1, and the pitch between each two adjacent electrode terminals 3 is assumed to be P. In the connecting region 5 between the tape carrier 1 and the display panel 7, the end portion 11 near the cut end 6 of each electrode terminal 3 is formed more narrow over a length of l (l=about 0.1 to 0.2 mm) than the remaining portion so that the width W1 of the electrode 3 becomes W2 in end portion. This configuration makes the electrode-to-electrode gap in the end portion G2 (WP−W2) larger than that in the remaining portion G1 which is calculated by (P−W1). With an electrode pitch P of about 300 μm and an electrode width W1 of about 150 μm, for instance, the electrode-to-electrode gap G1 is about 150 μm. With this condition, when about 100 μm, about 80 μm and about 50 μm are selected for the electrode width W2, the gap G2 becomes about 200 μm (130% of G1), about 220 μm (147% of G1) and about 250 μm (167% of G1) respectively. As a result, it is possible to prevent leakage and/or short circuits between electrodes if metal particles are concentrated in the anisotropic conductive film portion 9 outside the cut end 6 of the tape carrier 1.

When the anisotropic conductive film 8 is used in connecting the tape carrier 1 with the display panel 7, the anisotropic conductive film 8 can be pressed out not only to the area outside the cut end 6 but also to the area outside the panel end 10. Leakage and/or short circuits between electrodes in this area outside the display panel end 10 can be prevented by forming the electrode portion 12 in this area in a similar manner as in the end portion 11 of each electrode near the cut end 6, as illustrated in FIG. 3. This portion 12 of each electrode 3 is formed to be more narrow over a length of l (l=about 0.1 mm to 0.2 mm, for example). The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

According to the present invention, as described above, at least the end portion in the connecting region of each electrode is formed narrower than the electrode in the central portion of the connecting region, thereby realizing a practically useful display device which has eliminated the possibility of leakage and/or short circuit in the end portions of the joint.

While only certain embodiments of the present invention have been described, it will be apparent to those skilled in the art that various changes and modifications may be made therein without departing from the spirit and scope of the present invention as claimed.

What is claimed is:

1. A display device comprising:
   a display panel having a plurality of electrodes;
   a driver circuit having electrodes corresponding to the electrodes of said display panel; and
   anisotropic conductive film for electrically connecting the electrodes of said display panel with the electrodes of said driver circuit;
   wherein each driver circuit having a connecting part to be connected with each electrode of said display panel comprises a first connecting portion and a second connecting portion, said first connecting portion having a smaller width than said second connecting portion.

2. The display device of claim 1, wherein said first connecting portion comprises an end portion of said connecting part.

3. The display device of claim 1, wherein said driver circuit comprises a tape carrier having an LSI driver mounted thereon.

4. The display device of claim 1, wherein said connecting part of each electrode of said driver circuit contains a third connecting portion which is smaller in width than said second connecting portion.

5. The display device of claim 4, wherein said first and second connecting portions are formed on both sides of said second connecting portion, respectively.

6. A display device comprising:
 a tape carrier having electrodes;
 a display panel having multiterminal electrodes; and
 anisotropic film being disposed between said electrodes of said tape carrier and said electrodes of said display panel for connecting said electrodes of said tape carrier and said display panel in response to heating under pressure;
 wherein each of said electrodes of said tape carrier is more narrow in the end portion than in the central portion of the part to be in contact with each of said electrodes of said display panel.

7. The device of claim 1 wherein said plurality of electrodes comprise a plurality of terminals.

* * * * *